United States Patent
Ohnuma et al.

(10) Patent No.: US 7,139,996 B2
(45) Date of Patent: Nov. 21, 2006

(54) MASK PATTERN CORRECTION APPARATUS AND MASK PATTERN CORRECTION METHOD AND MASK PREPARATION METHOD AND METHOD OF PRODUCTION OF A SEMICONDUCTOR DEVICE

(75) Inventors: Hidetoshi Ohnuma, Kanagawa (JP); Kazuyoshi Kawahara, Kanagawa (JP)

(73) Assignee: Sony Corporation (JP)

( * ) Notice: Subject to any disclaimer, the term of this patent is extended or adjusted under 35 U.S.C. 154(b) by 283 days.

(21) Appl. No.: 10/468,211

(22) PCT Filed: Dec. 19, 2002

(86) PCT No.: PCT/JP02/13284

§ 371 (c)(1),
(2), (4) Date: Aug. 18, 2003

(87) PCT Pub. No.: WO03/052512

PCT Pub. Date: Jun. 26, 2003

(65) Prior Publication Data
US 2004/0073885 A1 Apr. 15, 2004

(30) Foreign Application Priority Data
Dec. 19, 2001 (JP) .............................. 2001-386443

(51) Int. Cl.
- G06F 17/50 (2006.01)
- G06K 9/00 (2006.01)
- G03F 1/00 (2006.01)

(52) U.S. Cl. .................. 716/19; 382/144; 382/149; 430/5

(58) Field of Classification Search ............ 700/121; 716/19–21; 382/144, 149; 430/5
See application file for complete search history.

(56) References Cited

U.S. PATENT DOCUMENTS

| 5,879,844 A | 3/1999 | Yamamoto et al. |
| 6,077,310 A * | 6/2000 | Yamamoto et al. ........... 716/19 |
| 6,470,489 B1 * | 10/2002 | Chang et al. ................. 716/21 |

(Continued)

FOREIGN PATENT DOCUMENTS

JP         08-76348 A1     3/1996

(Continued)

OTHER PUBLICATIONS

International Search Report dated Apr. 15, 2003.

*Primary Examiner*—Stacy A. Whitmore
(74) *Attorney, Agent, or Firm*—Rader, Fishman, & Grauer PLLC; Ronald P. Kananen

(57) ABSTRACT

By correcting an optical proximity effect with respect to design patterns by an optical proximity effect correcting means and simulating patterns after the correction of optical proximity effect by a simulation means, transfer patterns of gate electrodes are generated and measurement portion in the transfer patterns of the gate electrodes are changed in accordance with characteristics required for a circuit. Then, in accordance with whether the point required from the circuit is a higher speed, stability, or a reduction of a leakage current, it is judged whether or not a deviation from the design value at the measurement point of the transfer pattern of the gate electrode as explained above is within an allowable range. The pattern of the measurement point is shifted when the deviation is not within the allowable range. By repeating feedback until the measurement point is within an allowable range, the optimum correction is performed in accordance with the characteristics required from the circuit within a range where it functions as a gate electrode.

20 Claims, 13 Drawing Sheets

U.S. PATENT DOCUMENTS

| | | |
|---|---|---|
| 6,482,662 B1 | 11/2002 | Lee et al. |
| 6,567,972 B1 * | 5/2003 | Tanaka et al. ................. 716/21 |
| 6,634,018 B1 * | 10/2003 | Randall et al. ............... 716/19 |
| 6,868,175 B1 * | 3/2005 | Yamamoto et al. ......... 382/145 |
| 2001/0049811 A1 * | 12/2001 | Taoka ............................ 716/4 |
| 2002/0026626 A1 * | 2/2002 | Randall et al. ............... 716/19 |
| 2004/0015808 A1 * | 1/2004 | Pang et al. ................... 716/19 |

FOREIGN PATENT DOCUMENTS

| | | |
|---|---|---|
| JP | 9-319067 A1 | 12/1997 |
| JP | 2000-47366 A1 | 2/2000 |
| JP | 2001-118788 A1 | 4/2001 |

* cited by examiner

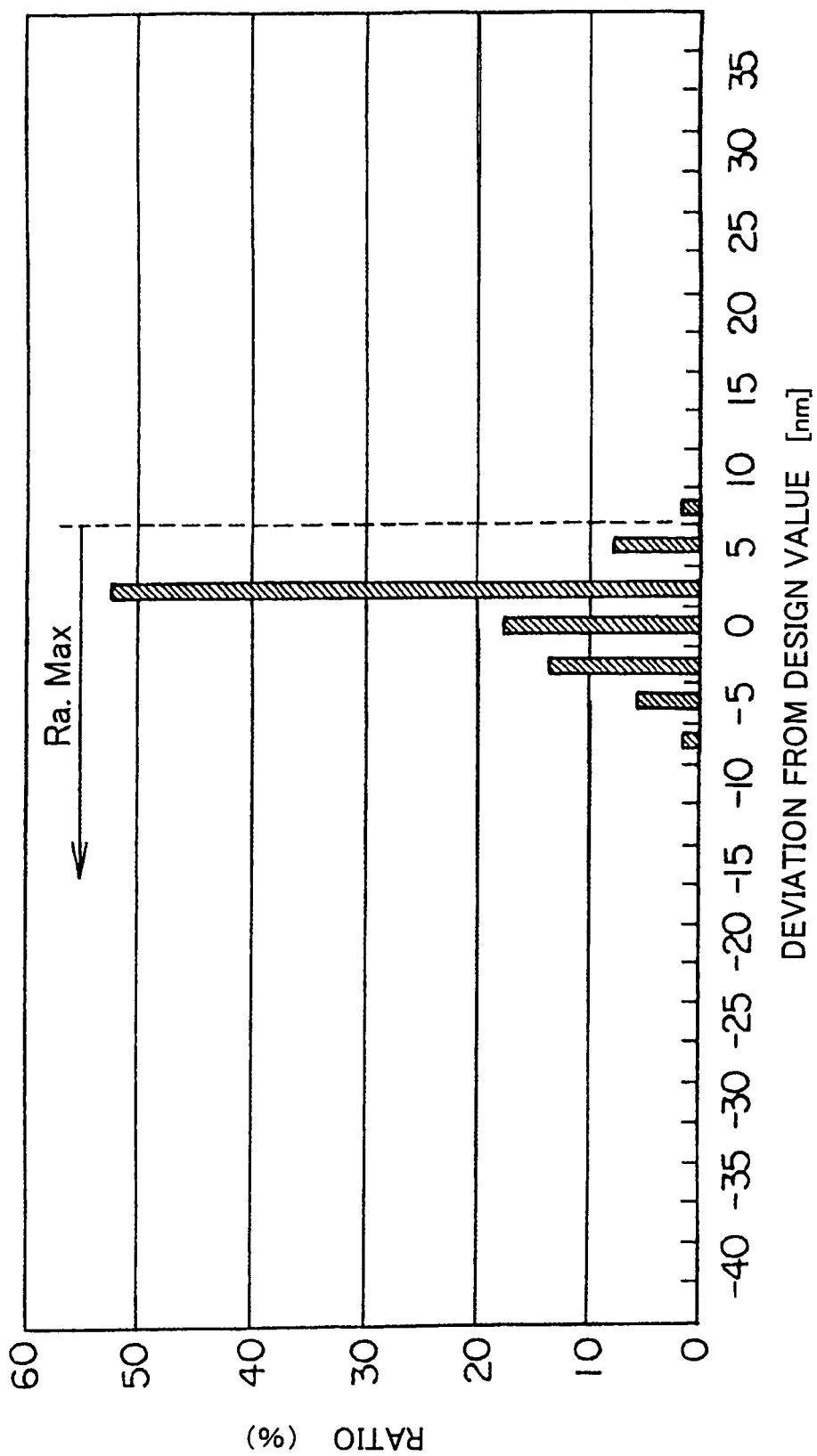

MASK PATTERN CORRECTION APPARATUS AND MASK PATTERN CORRECTION METHOD AND MASK PREPARATION METHOD AND METHOD OF PRODUCTION OF A SEMICONDUCTOR DEVICE

TECHNICAL FIELD

The present invention relates to a mask pattern correction apparatus and a mask pattern correction method for correcting design patterns of a mask used in, for example, a lithography process of a semiconductor device and to a mask preparation method and a method of production of a semiconductor device.

BACKGROUND ART

A photo mask used in the production process of a semiconductor device is structured as a glass substrate formed with a light shielding film. The lithography process of a semiconductor device is carried out by projecting and exposing this photo mask onto a wafer.

In the photo mask used in the lithography process, it is necessary to convert designed CAD data to data for the lithography system and faithfully pattern this on the light shielding film on the glass substrate.

Further, even if the patterning of the photo mask is correct, occurrence of pattern deterioration on the wafer referred to as the "optical proximity effect" at the time of exposure becomes a problem.

This is a phenomenon where a stepper beam passing through an opened mask pattern shape is diffracted or interfered with and as a result is not correctly resolved on the wafer surface.

As one of the optical proximity effects, there is the self optical proximity effect wherein the stepper beam is diffracted at its own pattern and as a result the finished dimensions of the pattern resolved on the wafer end up becoming different or, in a rectangular pattern, the precision of the finished dimensions ends up greatly differing at both the short sides and the long sides. Further, there is a mutual optical proximity effect where there is interference with a stepper beam diffracted from another pattern and, as a result, the finished dimensions on the wafer end up becoming different.

In this way, in the photolithography process in the production process of a semiconductor device, the dimensional error between design patterns and actual resist patterns occurring due to the optical proximity effect becomes a problem.

In the past, in optical proximity effect correction masks used to deal with this, first, a mask dimension correction value minimizing the pattern dimensional error with respect to a design pattern was determined by shape simulation or results of exposure experiments. Then, this correction value was used to correct the dimensions of the design pattern and that data used for a mask EB lithography system.

Up to today, for a purpose of faithful reproduction according to the design patterns, a variety of optical proximity effect correction techniques have been developed.

In the production of the increasingly miniaturized semiconductor devices in recent years, however, it is very difficult to obtain a perfect resist pattern corresponding to the design pattern by an optical proximity effect correction technique. Some deviation from the design pattern occurs.

In this case, if it is intended to correct the patterns so that all of the patterns become as designed, an enormous time would be required.

Here, for example, in a MOS integrated circuit, the highest line width controllability is required when processing the gate electrodes.

The gate pattern width of a transistor, i.e., what is generally called the "gate length", determines the gate threshold voltage, mutual conductance, and other transistor characteristics. Accordingly, since variation in the line width of the gate length directly affects variation in characteristics, control of the line width of a gate electrode pattern is most important in formation of a MOS transistor.

In this case as well, like in the past, correction for faithfully reproducing all of the gate electrode patterns corresponding to the design patterns is very difficult in practice due in part also to the fact that the line width of a gate electrode pattern is particularly fine. Further, there is a problem in that the correction time of the patterns becomes enormous.

As described above, in the past, it was attempted to faithfully reproduce all patterns according to the design patterns. It would be useful if it were possible to correct patterns in a practical range according to the required circuit characteristics at mainly portions functionally related with the device characteristics.

DISCLOSURE OF THE INVENTION

The present invention was made in consideration with the above circumstance and has as an object thereof to provide a mask pattern correction device and a mask pattern correction method able to optimize pattern portions functionally related with device characteristics while suppressing an increase of the pattern correction time.

Further, another object of the present invention is to provide a mask preparation method giving patterns optimized as described above.

Further, still another object of the present invention is to provide a method of production of a semiconductor device performing exposure using a mask having patterns optimized as described above.

To attain the above objects, a mask pattern correction apparatus of the present invention comprises an optical proximity effect correcting means for correcting an optical proximity effect with respect to design patterns; a simulation means for finding by simulation the transfer patterns to be obtained when performing exposure under predetermined transfer conditions using the corrected patterns obtained by the correction of the optical proximity effect; a transfer pattern measuring means for measuring dimensions or locations of portions functionally related with device characteristics among found the transfer patterns; and a pattern deforming means for deforming the corrected patterns so that the measured portions of the transfer patterns fall within an allowable range when the dimensions or locations are out of the allowable range.

To attain the above objects, a mask pattern correction method of the present invention comprises a first step of correcting an optical proximity effect with respect to a design pattern; a second step of finding by simulation a transfer pattern to be obtained when performing exposure under predetermined transfer conditions by a corrected pattern obtained by correction of the optical proximity effect; a third step of measuring a dimension or location of a portion functionally related with device characteristics in the found transfer pattern; a fourth step of judging whether or not the measured dimension or location is out of an allowable range; and a fifth step of deforming the corrected pattern so that the measured portion of the transfer pattern falls within the allowable range when judging that the measured dimension or location is out of the allowable range.

To attain the above objects, a mask preparation method of the present invention comprises a first step of correcting an optical proximity effect with respect to a design pattern; a second step of finding by simulation a transfer pattern to be obtained when performing exposure under predetermined transfer conditions by a corrected pattern obtained by correction of the optical proximity effect; a third step of measuring a dimension or location of a portion functionally related with device characteristics in the found transfer pattern; a fourth step of judging whether or not the measured dimension or location is out of an allowable range; a fifth step of deforming the corrected pattern so that the measured portion of the transfer pattern falls within the allowable range when judging that the measured dimension or location is out of the allowable range; and a sixth step of preparing a mask having a deformed recorrected pattern.

To attain the above objects, a method of production of a semiconductor device of the present invention comprises a first step of correcting an optical proximity effect with respect to a design pattern; a second step of finding by simulation a transfer patterns to be obtained when performing exposure under predetermined transfer conditions by a corrected pattern obtained by correction of the optical proximity effect; a third step of measuring a dimension or location of a portion functionally related with device characteristics in the found transfer pattern; a fourth step of judging whether or not the measured dimension or location is out of an allowable range; a fifth step of deforming the corrected pattern so that the measured portion of the transfer pattern falls within the allowable range when judging that the measured dimension or location is out of the allowable range; a sixth step of preparing a mask having a deformed recorrected pattern; and a seventh step of performing exposure under the same conditions as the transfer conditions via the prepared mask having the recorrected pattern to transfer the pattern to the semiconductor device.

BRIEF DESCRIPTION OF THE DRAWINGS

FIG. 2A is a schematic view of design patterns input to a mask pattern correction apparatus according to the present embodiment, while

FIG. 6A is a schematic view for explaining processing for judging whether or not there is an overlap between the pattern of the gate electrode extracted from the design pattern and the transfer pattern, while

FIG. 7A is a schematic view for explaining a method of measuring a center portion of the transfer pattern, while

FIG. 8 shows the distribution of deviation of the maximum line width of the transfer pattern from a design value.

BEST MODE FOR CARRYING OUT THE INVENTION

Figure 1:
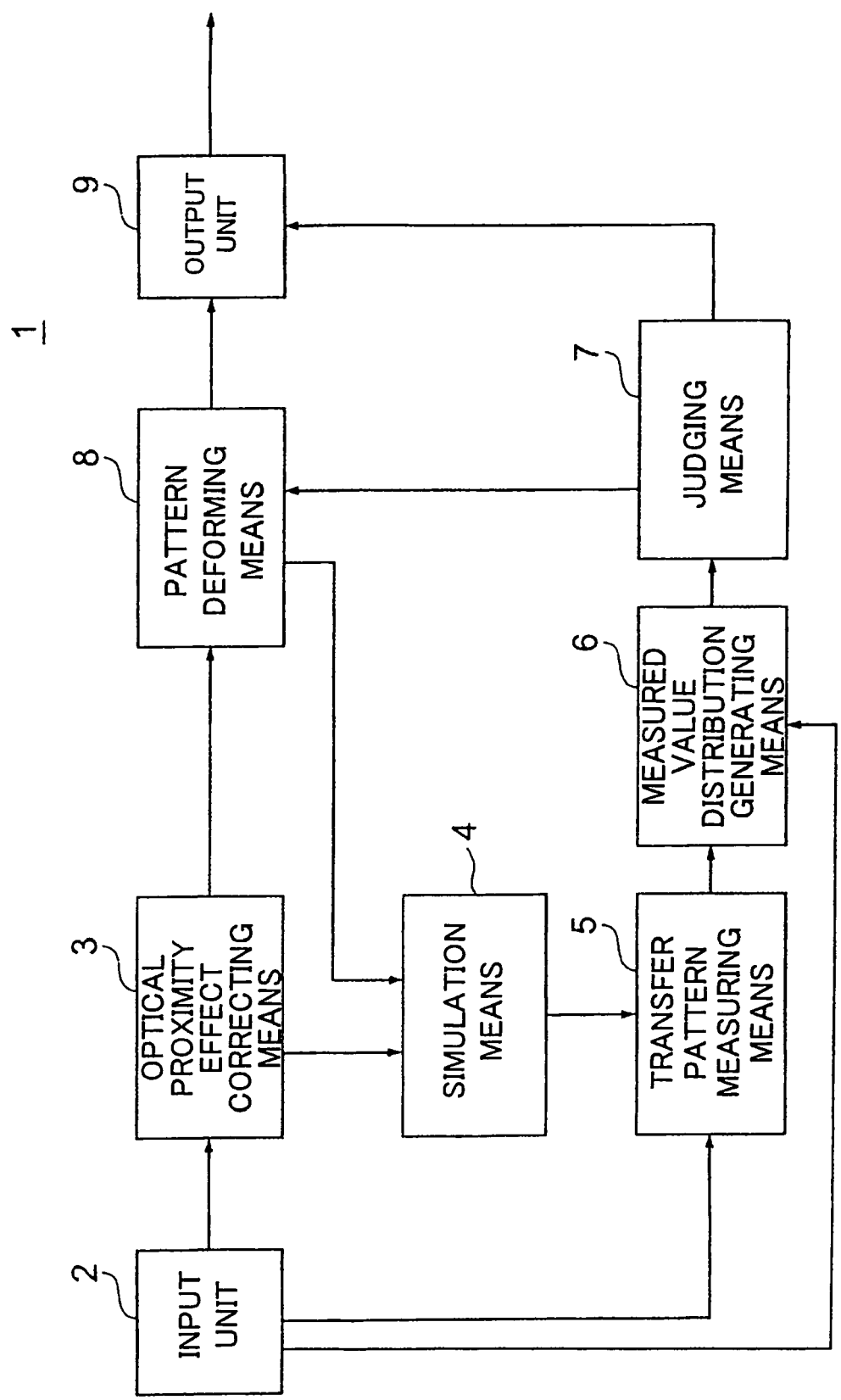
FIG. 1 is a block diagram of an example of the configuration of a mask pattern correction apparatus according to a first embodiment.

Below, an explanation will be given of embodiments of a mask pattern correction apparatus, a mask pattern correction method, a mask preparation method, and a method of production of a semiconductor device of the present invention by referring to the drawings.

FIG. 1 is a block diagram of an example of a mask pattern correction apparatus 1 according to the present embodiment.

The mask pattern correction apparatus 1 according to the present embodiment has an input unit 2; an optical proximity effect correcting means 3; a simulation means 4; a transfer pattern measuring means 5; a measured value distribution generating means 6; a judging means 7; a pattern deforming means 8; and an output unit 9.

The input unit 2 receives as input the design patterns of the mask patterns for exposure laid out by CAD or the like, transfer conditions, key point information required at the circuit, and so on.

The design patterns and the transfer conditions input to the input unit 2 are output to the optical proximity effect correcting means 3. Further, the design patterns and the key point information input to the input unit 2 are output to the transfer pattern measuring means 5. Note that, it is also possible that the design patterns input to the input unit 2 are output to the measured value distributing means 6.

Figure 2A:
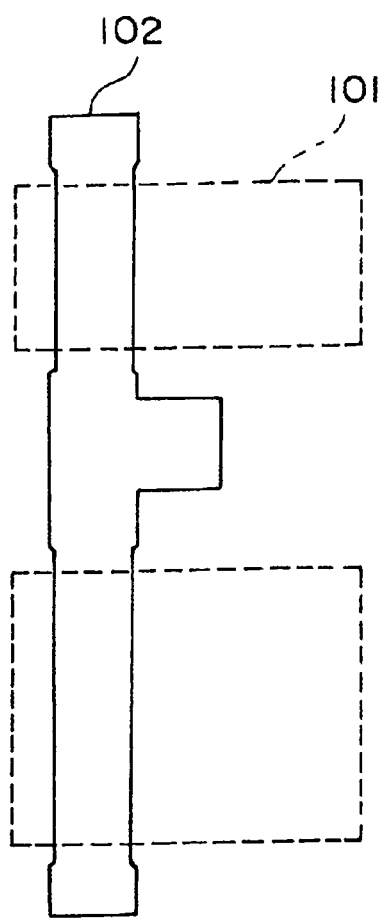

The design patterns include, for example, as shown in FIG. 2A, a pattern 101 of an active region comprised by a diffusion layer etc. in addition to a pattern 102 of a gate electrode for formation of the mask pattern, for example, for pattern correction.

As the transfer conditions, for example, conditions concerning a wavelength λ of the light used for the exposure, numerical aperture NA, an apparent a magnitude (partial coherence) of the light source, or a transmission rate distribution of the light source, a phase/transmission rate distribution and defocus of a pupil, etc. are input.

As the key point information required in the circuit, the speed of the circuit, stability of the circuit, reduction of a leakage current of the circuit, and other information are input.

The optical proximity effect correcting means 3 receives as input the design patterns and the transfer conditions from the input unit 2, corrects the optical proximity effect, and outputs the corrected patterns after the correction of the optical proximity effect to the simulation means 4 and the pattern deforming means 8.

The optical proximity effect correcting means 3 determines for example the correction rule of the optical proximity effect corresponding to line widths and intervals of the design patterns for every transfer condition in advance by the simulation or exposure experiments, applies the correction rule to the line widths and intervals of the found design patterns, and thereby obtains the corrected patterns after correction of the optical proximity effect.

As such an optical proximity effect correcting means 3, there is a means of touching up the shape of the design patterns or providing dummy patterns in the vicinity of the design patterns.

Figure 2B:
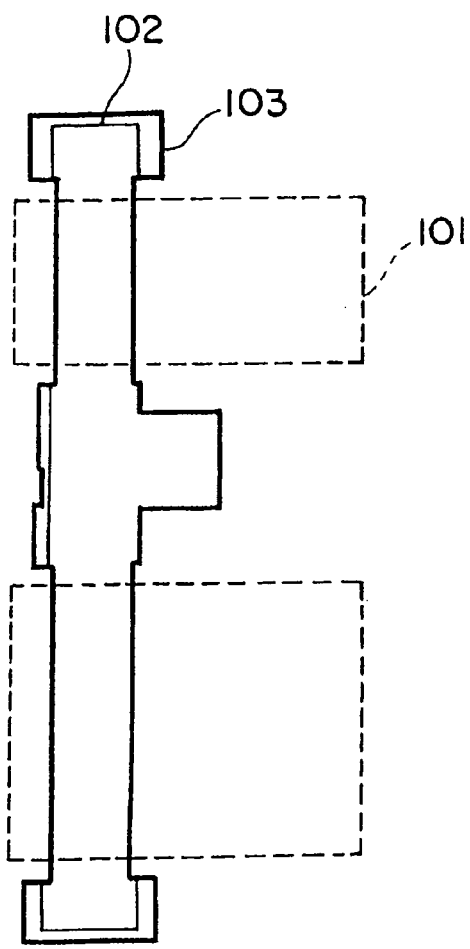
FIG. 2B is a schematic view of corrected patterns after correction of an optical proximity effect with respect to the design pattern.

When receiving as input for example design patterns including the pattern 102 of the gate electrode shown in FIG. 2A, the optical proximity effect correcting means 3 generates a corrected pattern 103 of the gate electrode after correction of the optical proximity effect as shown in FIG. 2B in accordance with the transfer conditions.

The simulation means 4 receives as input the transfer conditions together with the corrected patterns after correction of the optical proximity effect by the optical proximity effect correcting means 3, simulates the transfer patterns to the resist or the like based on the transfer conditions and the corrected patterns after correction of the optical proximity effect, and outputs the transfer patterns after the simulation to the transfer pattern measuring means 5. Note that the transfer patterns are transfer images obtained by simulation.

Further, as will be explained later, when receiving as input patterns after deformation by the pattern deforming means 8, the simulation means 4 performs simulation based on the transfer conditions and outputs the transfer patterns obtained by simulation to the transfer pattern measuring means 5.

As the simulation means 4, use is made of, for example a commercially available light intensity simulation system able to simulate transfer patterns by receiving as input transfer conditions and corrected patterns.

Figure 3:
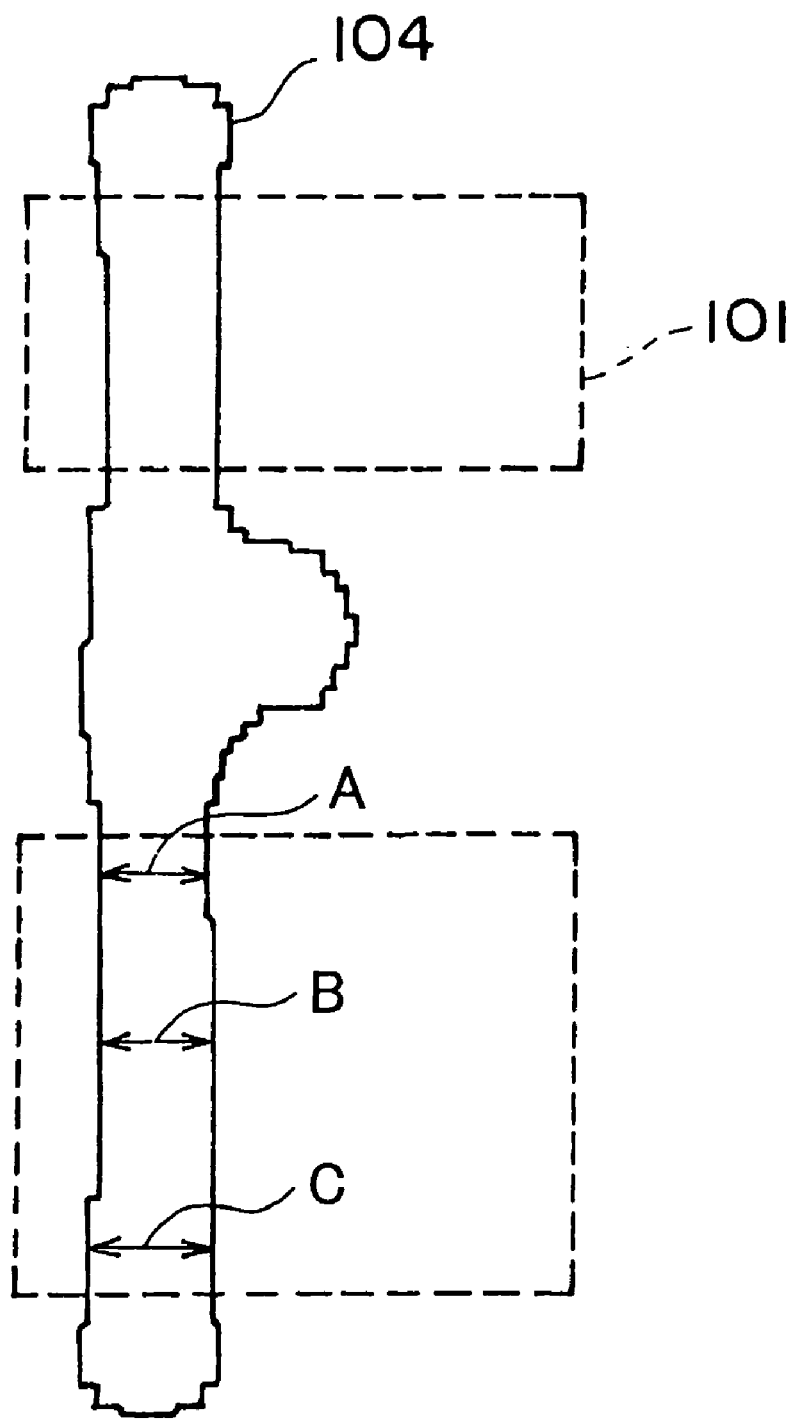
FIG. 3 is a schematic view of transfer patterns of a gate electrode calculated by a simulation means of the mask pattern correction apparatus according to the present embodiment with respect to the patterns after correction of the optical proximity effect.

When receiving as input for example the corrected pattern 103 of the gate electrode after correction of the optical proximity effect shown in FIG. 2B, the simulation means 4 generates a transfer pattern 104 of the gate electrode as shown in FIG. 3 based on the transfer conditions.

The transfer pattern measuring means 5 receives as input the transfer patterns generated by the simulation means 4, measures the dimensions or the locations of the pattern portions functionally related with the device characteristics among the transfer patterns in accordance with the key point information (information concerning performance required from the device) input from the input unit 2, and outputs measured values to the measured value distribution generating means 6. Note that the "dimensions" referred to here include also the area of a pattern, amount of distortion with respect to a design pattern, etc.

For example, when receiving as input the transfer pattern 104 of the gate electrode as shown in FIG. 3 from the simulation means 4, the transfer pattern measuring means 5 measures the gate length in the portion substantially functioning as the gate electrode, that is, the portion overlapped with the pattern 101 of the active region in the transfer pattern 104 of the gate electrode. Then, in this portion overlapped with the pattern 101 of the active region, the measurement portion is switched in accordance with the key point information. For example, the length of either of the minimum line width A with which the gate length becomes the minimum, a line width B of the center of the portion functioning as the gate electrode, and the maximum line width C with which the gate length becomes the maximum is measured.

An example of a technique for measurement of the gate length using the transfer pattern measuring means 5 in the case where the design pattern is an interconnect pattern including a gate will be explained next.

Figure 4A:
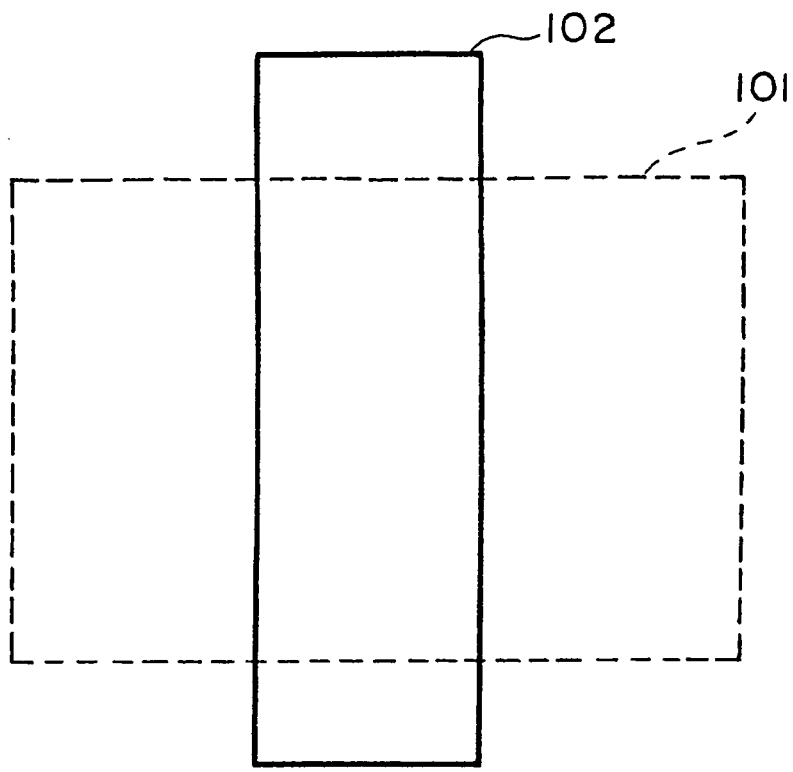
FIGS. 4A and 4B are views for explaining a method of measuring a gate length at each measurement point of the gate electrode by a transfer pattern measuring means.
Figure 4B:
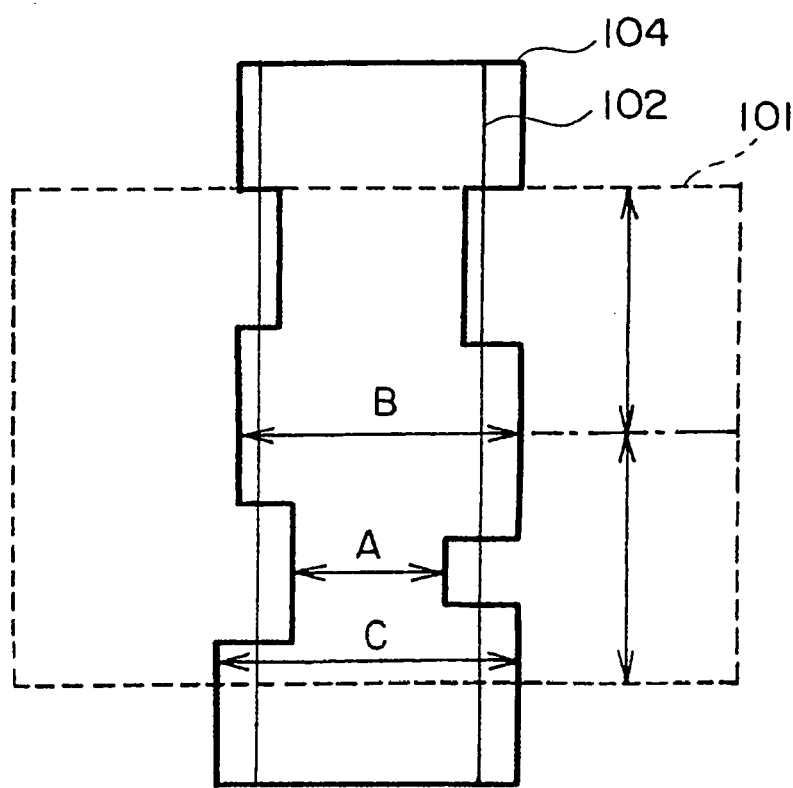

Here, the explanation will be given taking as an example a case of measuring the minimum line width A of the transfer pattern 105 of the gate electrode, the line width B of the center portion, and the maximum line width C when the transfer pattern 104 of the gate electrode as shown in FIG. 4B is obtained by simulation after correcting the optical proximity effect for design patterns having the pattern 101 of the active region and the pattern 102 of the gate electrode as shown in FIG. 4A.

Figure 5A:
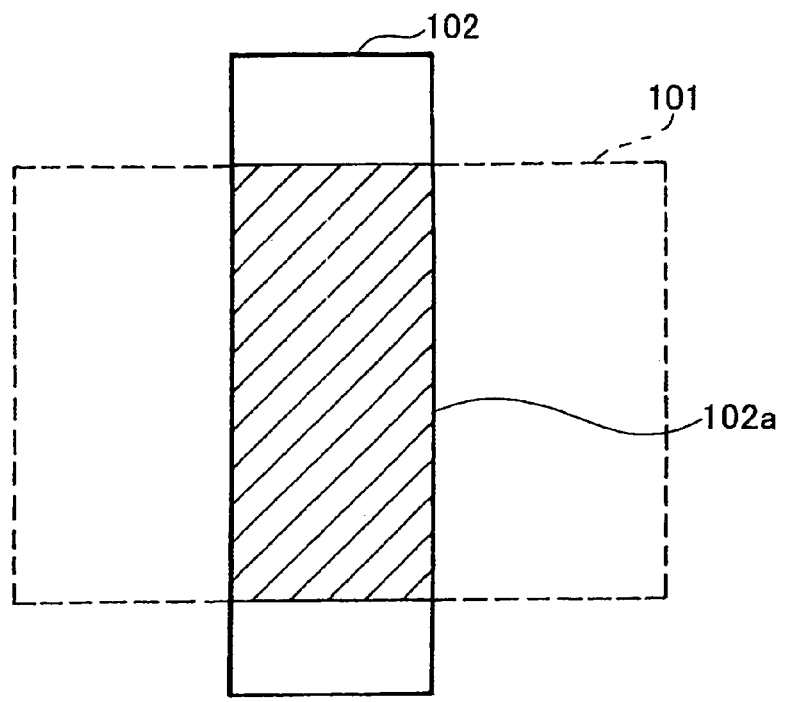
FIGS. 5A and 5B are views for explaining the method of measuring the gate length at each measurement point of the gate electrode by the transfer pattern measuring means.

The transfer pattern measuring means 5 receives as input the design patterns shown in FIG. 5A from the input unit 2, performs AND processing for the pattern 102 of the gate electrode and the pattern 101 of the active region in the design patterns, and extracts a pattern 102a substantially functioning as the gate as shown by the hatching of FIG. 5A.

Figure 5B:
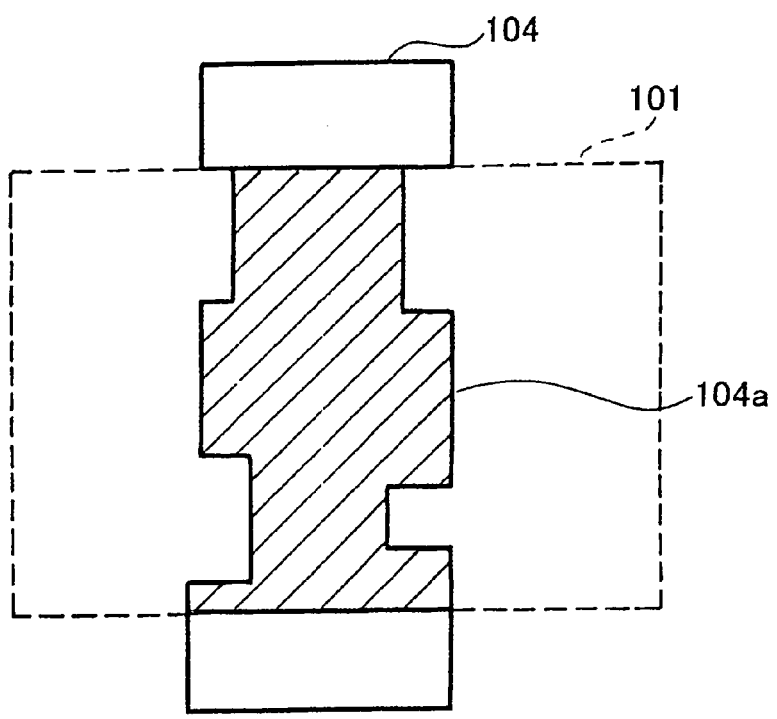

Further, the transfer pattern measuring means 5 receives as input the transfer pattern 104 of the gate electrode shown in FIG. 5B from the simulation means 4, performs AND processing for the transfer pattern 104 of the gate electrode and the pattern 101 of the active region, and extracts a transfer pattern 104a substantially functioning as the gate as shown by the hatching of FIG. 5B.

For example, when there are a plurality of patterns of gate electrodes having gate lengths of 150 nm, 260 nm, and 340 nm in the design patterns, patterns 102a of the portions functioning as the gate electrodes extracted from the design patterns are grouped by gate length.

Below, an explanation will be given of a case of measuring the gate length of a transfer pattern 104a of a gate electrode for a pattern having for example a gate length of 150 nm among the patterns 102a of the gate electrode grouped from the design patterns.

Figure 6A:
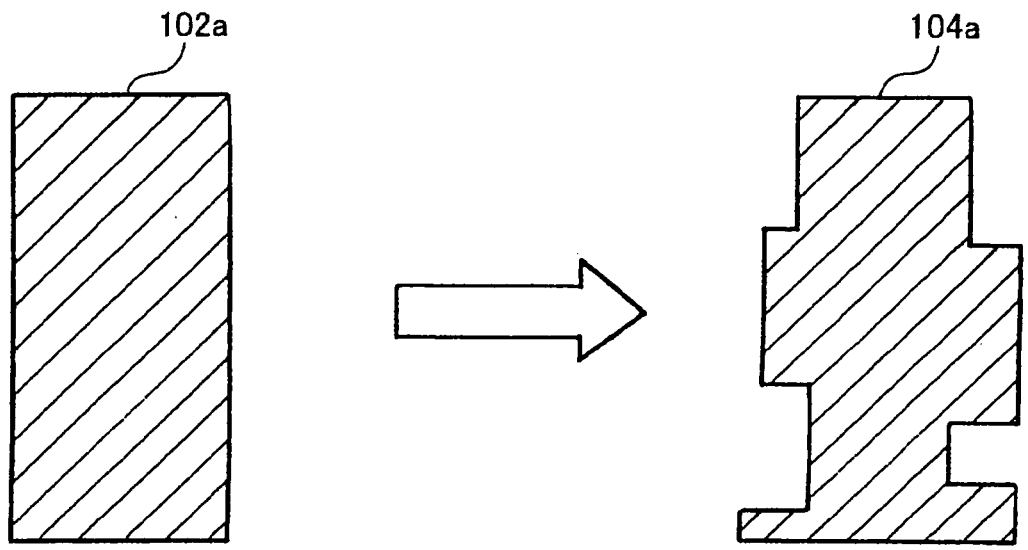

As shown in FIG. 6A, after AND processing, only the pattern 102a of the gate electrode having the gate length of 150 nm is extracted, then whether or not the pattern 102a of the gate electrode and the transfer pattern 104a of the portion functioning as the gate electrode overlap even in part is checked.

Then, when there is an even partially overlapped portion, the transfer pattern 104a of the gate electrode is recognized as a measurement target.

Figure 6B:
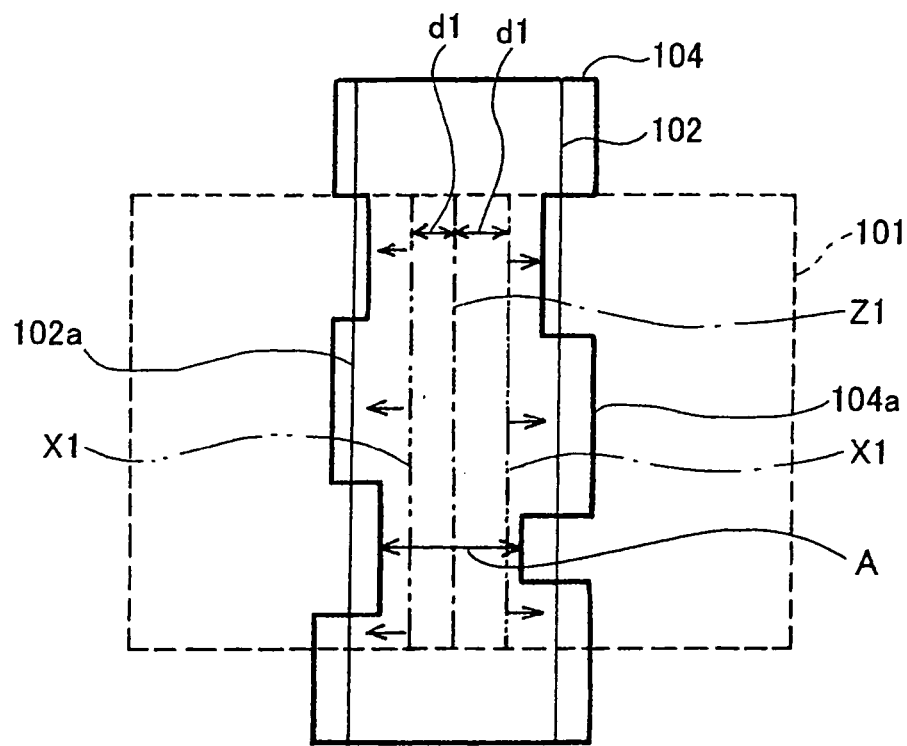
FIG. 6B is a schematic view for explaining a method of measuring the minimum line width of the transfer pattern.

For example, a case of measuring the minimum line width A of the transfer pattern 104a of the gate electrode detected in an inspection of overlap with a pattern 102a of a gate electrode having a gate length of 150 nm will be explained. First, as shown in FIG. 6B, a center line Z1 forming the center in a gate length direction of the design pattern 102a is set. Using this center line Z1 as a reference, detection lines x1 are set at locations at intervals of for example 50 nm in a gate length direction from the center line Z1 with respect to the transfer pattern 104a of the gate electrode. Then, the detection lines x1 are extended outward in steps of 1 to 2 nm from the inside. The line width between the detection lines x1 in a portion where the transfer pattern 104a of the gate electrode is detected first is determined as the minimum line width A of the transfer pattern 104a of the gate electrode.

Figure 7A:
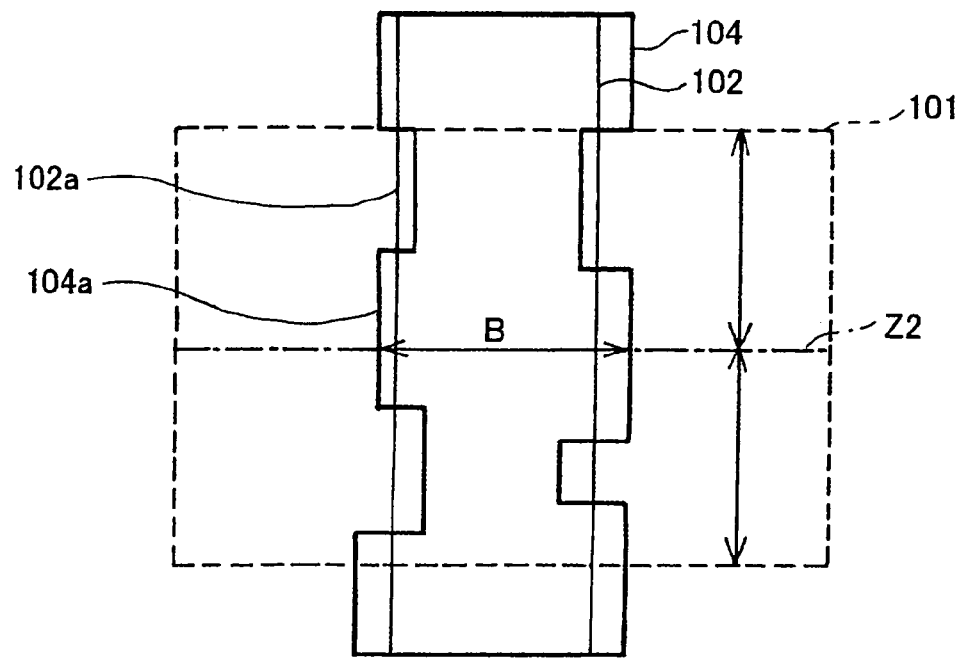

The case of measuring the line width B of the center portion of the transfer pattern 104a of the gate electrode will be explained next. First, as shown in FIG. 7A, the design pattern 102a of the gate electrode is set with a center line Z2 forming the center in the gate width direction of the pattern 101 of the active region. Using this center line Z2 as a reference, the line width of the transfer pattern 104a of the gate electrode at the location of the center line Z2 is measured.

Figure 7B:
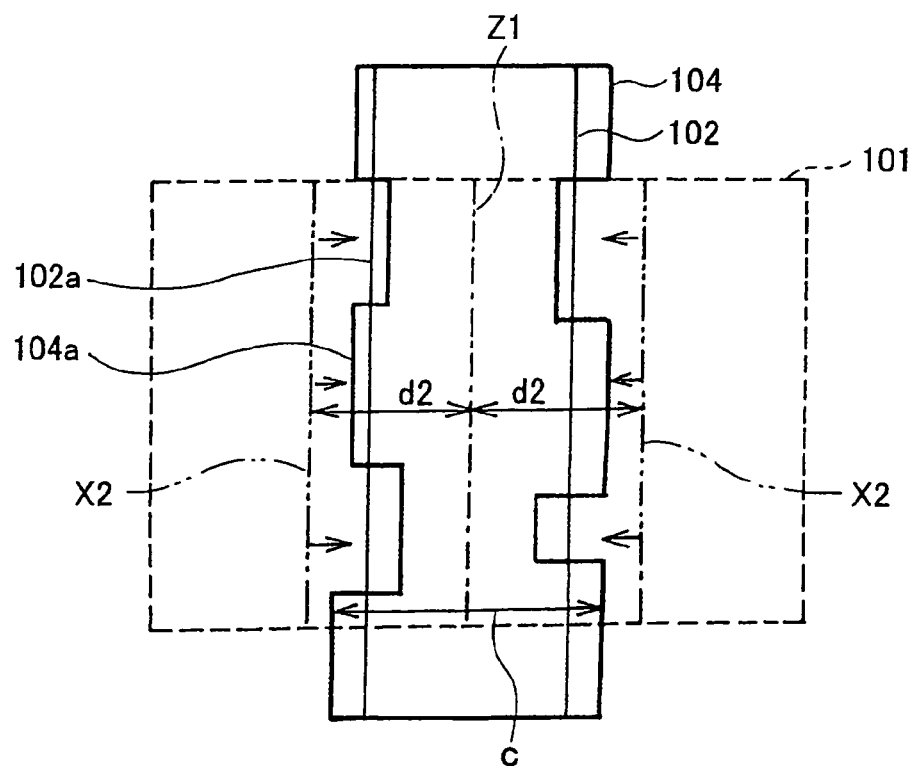
FIG. 7B is a schematic view for explaining a method of measuring the maximum line width of the transfer pattern.

The case of measuring the maximum line width C of the transfer pattern 104a will be explained next. First, as shown in FIG. 7B, the center line Z1 forming the center in the gate length direction of the design pattern 102a of the gate electrode is set. Using this center line Z1 as a reference, the transfer pattern 104a of the gate electrode is set with detection lines x2 at locations at intervals of for example 100 nm from the center line Z1 in the gate length direction. Then, the detection lines x2 are made narrower inward in steps of 1 to 2 nm from the inside. The line width between the detection lines x2 in the portion where the transfer pattern 104a of the gate electrode is detected first is determined as the maximum line width C of the transfer pattern 104a of the gate electrode.

In this way, the transfer pattern measuring means 5 measures the gate lengths of the transfer patterns 104a of the gate electrodes at the locations corresponding to the patterns 102a of the gate electrodes grouped for gate lengths from the design patterns over the entire surface of the chip.

The measured value distribution generating means 6 receives as input the measured values of the entire chip input from the transfer pattern measuring means 5 and generates a distribution of amounts of deviation from the plurality of design values of the measured values in the entire chip. For example, when the transfer pattern measuring means 5 measures the gate lengths of the transfer patterns of the gate electrodes, it receives as input either of the minimum line width A of the gate length, the line width B of the center portion, and the maximum line width C and generates the distribution of the amounts of deviation from the design values of the gate lengths of the entire chip. The distribution is prepared while grouping the transfer patterns for every gate length with which the dimensions must become the same in the design patterns.

When the maximum line width C of the transfer patterns of the gate electrodes is measured by the transfer pattern measuring means 5, a distribution of deviation from the design values shown as an example in FIG. 8 is generated.

Figure 9:
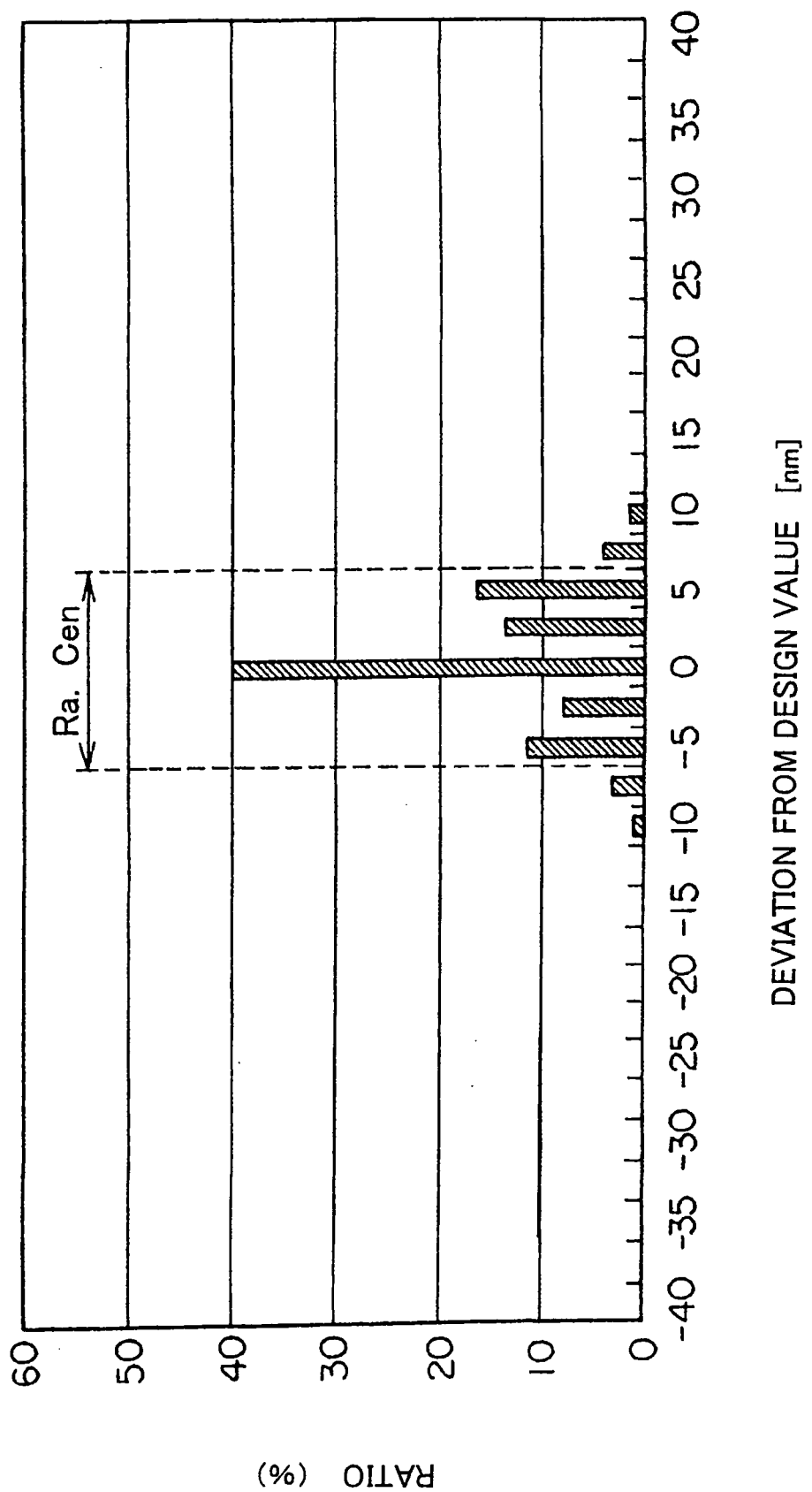
FIG. 9 shows the distribution of deviation of the center portion of the transfer pattern from a design value.

When the line width B of the center portion of the transfer patterns of the gate electrodes is measured by the transfer pattern measuring means 5, a distribution of deviation from the design values shown as an example in FIG. 9 is generated.

Figure 10:
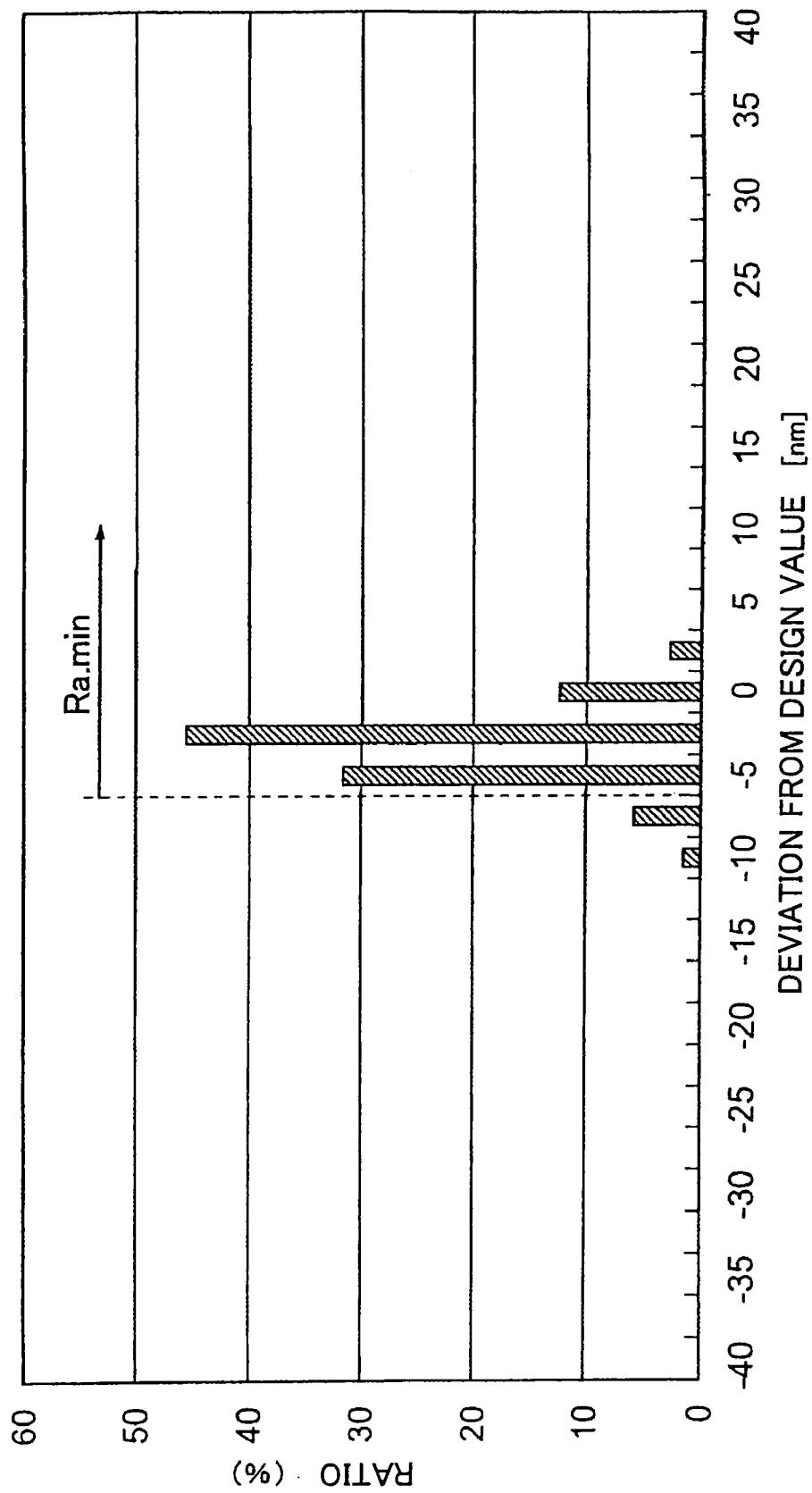
FIG. 10 shows the distribution of deviation of the minimum line width of the transfer pattern from a design value.

When the minimum line width A of the transfer patterns of the gate electrodes is measured by the transfer pattern measuring means 5, a distribution of deviation from the design values shown as an example in FIG. 10 is generated.

The judging means 7 judges whether or not the distribution of deviation of the measured values of the transfer patterns generated by the measured value distribution generating means 6 falls within the allowable range.

For example, it sets an amount of deviation from the design value of less than +5 nm as the allowable range Ra.Max for the distribution of deviation from the design value of the maximum line width C of the transfer pattern as shown in FIG. 8 and judges whether or not all of the distribution of deviation from the design value falls within the allowable range Ra.Max.

Further, for example, it sets an amount of deviation from the design value of −5 nm to +5 nm as the allowable range Ra.Cen for the distribution of deviation from the design value of the line width B of the center portion of the transfer pattern as shown in FIG. 9 and judges whether or not all of the distribution of deviation from the design value falls within the allowable range Ra.Cen.

Further, for example, its sets an amount of deviation from the design value of more than −5 nm as the allowable range Ra.Min for the distribution of deviation from the design value of the minimum line width A of the transfer pattern as shown in FIG. 10 and judges whether or not all of the distribution of deviation from the design value falls within the allowable range Ra.Min.

Then, the judging means 7 outputs the information (locations and amounts of deviation) of the transfer patterns having measured values out of the allowable range to the pattern deforming means 8 when even one part of the measured values is not in the allowable range.

Note that when the judging means 7 judges that all of the measured values of the transfer patterns are within the allowable ranges, it instructs the output unit 9 to output the patterns input from the pattern deforming means 8.

The pattern deforming means 8 receives as input the corrected patterns after correction of the optical proximity effect by the optical proximity effect correcting means 3 and deforms the corrected patterns after correction of the optical proximity effect based on the information (locations and amounts of deviations) of transfer patterns having dimensions or locations out of the allowable ranges input from the judging means 7.

For example, when the amount of deviation of a transfer pattern from the design pattern is +d, the pattern deforming means 8 shifts a corresponding portion of the corrected pattern after correction of the optical proximity effect input from the optical proximity effect correcting means 3 by exactly Bd.

Then, after deforming as desired the corrected pattern after correction of the optical proximity effect, the pattern deforming means 8 outputs the deformed recorrected pattern to the simulation means 4 and outputs the same to the output unit 9.

When the output unit 9 receives a judgment result indicating that the distribution of measured values is within the allowable range from the judging means 7, it outputs the deformed recorrected patterns input from the pattern deforming means 8 to the outside.

With the mask pattern correction apparatus according to the present embodiment having the above configuration, for example, the measurement points (minimum line width A, center portion B, maximum line width C) of the transfer patterns of the gate electrodes from the transfer pattern measuring means 5 can be changed in accordance with the key point information input to the input unit 2.

As the key point information, for example, there is the speed of the circuit, the reduction of the leakage current, or the stability of the circuit.

For example, when the key point information input to the input unit 2 is the speed, the maximum line width C in the transfer patterns of the gate electrodes is measured by the transfer pattern measuring means 5.

The gate line width has a large influence upon the speed. The thinner it is, the faster the operation can be made. This is because when there is a thick line width part in a gate electrode, the speed ends up being determined by that portion and the operation of the circuit becomes slow, so it is necessary to eliminate such thick line width parts.

Accordingly, for example, in the distribution of deviation of the maximum line width C from the design value shown in FIG. 8, the judging means 7 sets less than +5 nm from the design value as the allowable range Ra.Max. Then, when there is a transfer pattern of a gate electrode of more than +5 nm in the distribution of deviation, this is regarded as a correction target.

The allowable range is set in this way because the minimum unit by which the simulation means can generate a transfer pattern is 2.5 nm at the present stage. Further, less than +5 nm from the design value is a level judged as no problem in speed. Further, if the allowable range is set narrower, the correction time increases due to the increase of the correction targets.

When the key point information input to the input unit 2 is the stability of the circuit, the line width B of the center portion in the transfer patterns of the gate electrodes is measured by the transfer pattern measuring means 5.

This is because the center portion is the stablest in shape, so a stable transistor can be formed by setting the line width at the center portion according to the design pattern.

Accordingly, in the distribution of deviation of the line width B of the center portion from the design value shown in FIG. 9, the judging means 7 sets −5 nm to +5 nm from the design value as the allowable range Ra.Cen. Then, when there is a transfer pattern out of the distribution of deviation, this is regarded as a correction target.

The allowable range is set in this way because within 5 nm from the design value is a level judged as one where the difference from the design value does not exert any influence on the circuit characteristics. Further, if the allowable range is set up narrower, the correction time increases due to the increase of the correction targets.

When the key point information input to the input unit 2 is the reduction of the leakage current, the minimum line width A in the transfer patterns of the gate electrodes is measured by the transfer pattern measuring means 5.

If the gate line width is too thin, a leakage current is generated. This leakage current exerts an effect upon the transistor. For this reason, it is necessary to eliminate thin line width parts which would generate leakage current.

Accordingly, in the distribution of deviation of the minimum line width A from the design value shown in FIG. 10, the judging means 7 sets more than −5 nm from the design value as the allowable range Ra.Min where leakage current probably would not be generated. Then, when there is a transfer pattern of the gate electrode of less than −5 nm, that is, outside the allowable range Ra.Min, in the distribution of deviation, this is regarded as a correction target.

The allowable range is set in this way because more than −5 nm from the design value is a level judged as being free from generation of leakage current. Further, if the allowable range is set narrower, the correction time increases due to the increase of the correction targets.

Figure 11:
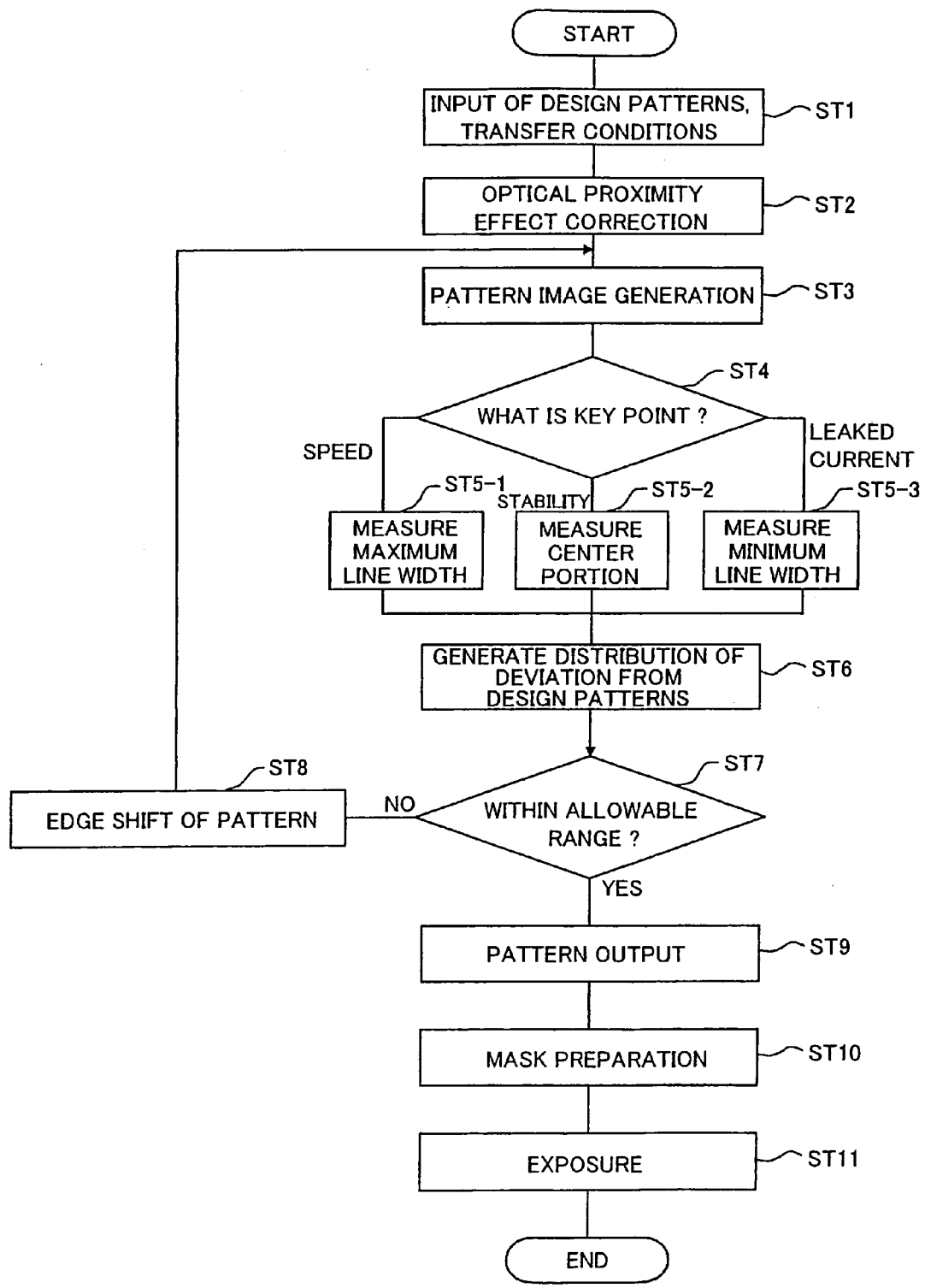
FIG. 11 is a flow chart of a mask pattern correction method, a mask preparation method, and a method of production of a semiconductor device according to the present embodiment.

Next, a pattern correction method, a mask preparation method, and a method of production of the semiconductor device using a pattern correction apparatus having the above configuration will be explained by using the flow chart shown in FIG. 11. Here, as an example, a pattern correction method of an interconnect pattern having a portion forming a gate of a transistor, a mask preparation method having the interconnect pattern, and a method of production of a semiconductor device forming the interconnect pattern will be explained.

First, for example, when design patterns having the pattern 102 of the gate electrode and the pattern 101 of the active region as shown in FIG. 2A and the transfer conditions are input to the input unit 2 (step ST1), the design patterns and the transfer conditions are input to the optical proximity effect correcting means 3, the design patterns are corrected for the optical proximity effect based on the transfer conditions by the optical proximity effect correcting means 3, and the corrected pattern 103 of the gate electrode as shown in FIG. 2B is generated (step ST2).

When the corrected pattern 103 of the gate electrode as shown in FIG. 2B is input to the simulation means 4 together with the transfer conditions, based on the transfer conditions, the simulation means 4 performs for example a light intensity simulation and for example generates a transfer pattern 104 of the gate electrode after the transfer to the resist etc. as shown in FIG. 3 (step ST3).

Then, when the simulation means 4 generates the transfer pattern 104 of the gate electrode after the simulation, the measurement points (minimum line width A, line width B of the center portion, and the maximum line width C) of the transfer pattern 104 of the gate electrode by the transfer pattern measuring means 5 are changed in accordance with the key point information input to the input unit 2 (step ST4).

For example, when the key point required from the circuit is the speed, the transfer pattern measuring means 5 measures the maximum line widths C of the transfer patterns 104 of the gate electrodes in the entire chip (step ST5-1), and the measured value distribution generating means 6 generates the distribution of deviation from the design value of the maximum line width C as shown in FIG. 8 (step ST6).

Then, for example, in the distribution of deviation as shown in FIG. 8, the judging means 7 judges whether or not the distribution of deviation is within the allowable range Ra.Max (step ST7).

Then, when there is a transfer pattern of the gate electrode out of the allowable range Ra.Max in the distribution of deviation shown in FIG. 8, the information of the transfer pattern of the gate electrode out of the allowable range Ra.Max (location and amount of deviation from the design value) is output to the pattern deforming means 8.

The pattern deforming means 8 shifts the corresponding portion of the corrected pattern after correction of the optical proximity effect input from the optical proximity effect correcting means 3 by exactly the amount of deviation so as to approach the design value based on the information of the transfer pattern of the gate electrode out of the allowable range Ra.Max extracted from the judging means 7 (step ST8).

Then, the pattern deforming means 8 outputs the recorrected pattern after deformation to the simulation means 4 again and repeats the processing of step ST3 to step ST7 to deform the pattern until the maximum line width C of the transfer patterns of the gate electrodes falls within the allowable range Ra.Max.

Note that it is necessary to apply such feedback because there is little possibility of a portion which was deformed in pattern once being detected again as the maximum line width, but sometimes another portion in the transfer pattern of the same gate electrode is detected next as the maximum line width and the maximum line width becomes out of the allowable range as shown in FIG. 7B.

Then, when repeating the above steps and the distribution of deviation from the design value of the maximum line width C of the transfer pattern of the gate electrode falls within the allowable range Ra.Max, the judging means 7 sends an instruction to output the recorrected pattern input from the pattern deforming means 8 to the output unit 9, and the pattern is output as the final corrected pattern (step ST9).

Further, for example, when the key point required for the circuit is the stability of the circuit, the transfer pattern measuring means 5 measures the line width B of the center portion of the transfer pattern of the gate electrode in the entire chip (step ST5-2), and the measured value distribution generating means 6 generates a distribution of deviation from all design values of the line width B of the center portion as shown in FIG. 9 (step ST6).

Then, for example, in the distribution of deviation as shown in FIG. 9, the judging means 7 judges whether or not the distribution of deviation is within the allowable range Ra.Cen (step ST7).

Then, when there is a transfer pattern of the gate electrode out of the allowable range Ra.Cen in the distribution of deviation shown in FIG. 9, the information of the transfer pattern of the gate electrode out of the related allowable range Ra.Cen (location and amount of deviation from the design value) is output to the pattern deforming means 8.

The pattern deforming means 8 shifts the corresponding portion of the corrected pattern after correction of the optical proximity effect input from the optical proximity effect correcting means 3 by exactly the amount of deviation so as to approach the design value based on the information of the transfer pattern of the gate electrode out of the allowable range Ra.Cen extracted from the judging means 7 (step ST8).

Then, the pattern deforming means 8 outputs the recorrected pattern after the deformation to the simulation means 4 again and repeats the processings of step ST3 to step ST7 to deform the pattern until the line width B of the center portion of the transfer patterns of the gate electrodes falls within the allowable range Ra.Cen.

Then, when repeating the above steps and the distribution of deviation from the design value of the center portion B of the transfer pattern of the gate electrode falls within the allowable range Ra.Cen, the judging means 7 sends an instruction to output the recorrected pattern input by pattern deforming means 8 to the output unit 9, and the output unit 9 outputs the pattern as the final corrected pattern (step ST9).

Further, for example, when the key point required from the circuit is the reduction of the leakage current, the transfer pattern measuring means 5 measures the minimum line width A of the transfer pattern of the gate electrode in the entire chip (step ST5-3), and the measured value distribution generating means generates the distribution of deviation from all design values of the minimum line width A as shown in FIG. 10 (step ST6).

Then, for example, in the distribution of deviation as shown in FIG. 10, the judging means 7 judges whether or not the distribution of deviation is within the allowable range Ra.Min (step ST7).

Then, when there is a transfer pattern of the gate electrode out of the allowable range Ra.Min in the distribution of deviation shown in FIG. 10, the information of the transfer pattern of the gate electrode out of the allowable range Ra.Min (location and amount of deviation from the design value) is output to the pattern deforming means 8.

The pattern deforming means 8 shifts the corresponding portion of the corrected pattern after correction of the optical proximity effect input from the optical proximity effect correcting means 3 by exactly the amount of deviation so as to approach the design value based on the information of the transfer pattern of the gate electrode out of the allowable range Ra.Min extracted from the judging means 7 (step ST8).

Then, the pattern deforming means 8 outputs the recorrected pattern after the deformation to the simulation means 4 again and repeats the processing of step ST3 to step ST7 to deform the pattern until the minimum line width A of the transfer pattern of the gate electrode falls within the allowable range Ra.Min.

Note that feedback must be given in this way for a reason similar to that explained in the maximum line width.

Then, when repeating the above steps and the distribution of deviation from the design value of the minimum line width A of the transfer pattern of the gate electrode falls within the allowable range Ra.Min, the judging means 7 sends an instruction to output the recorrected pattern input from the pattern deforming means 8 to the output unit 9, and the output unit 9 output this as the final corrected pattern (step ST9).

After the final corrected pattern is obtained, a mask having the final corrected pattern is prepared by using the EB lithography system ST10).

Figure 12:
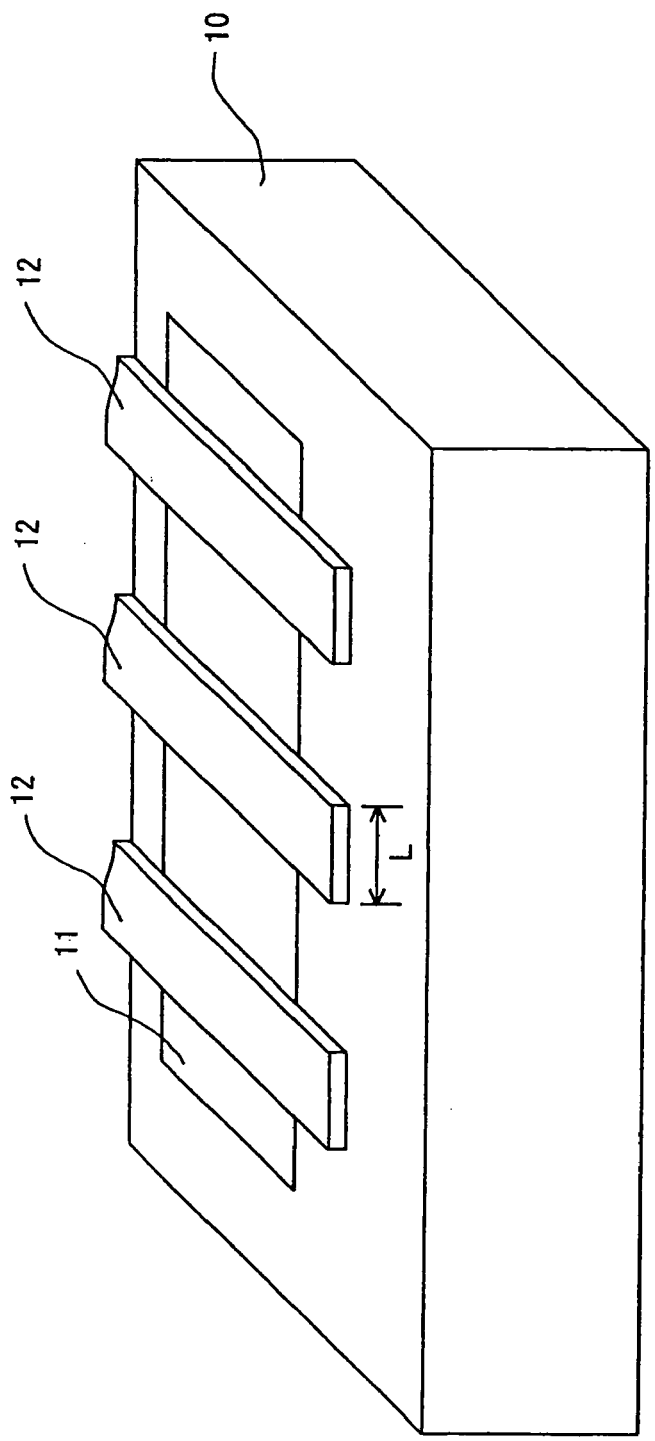
FIG. 12 is a perspective view of a principal part showing an example of the semiconductor device prepared by the method of production of a semiconductor device according to the present embodiment.

Then, the prepared mask is used to expose the pattern on the chip under the same transfer conditions as the transfer conditions simulated by the simulation means (step ST11). By this, as shown in the perspective view of the principal part of FIG. 12, a gate electrode 12 is formed on an active region 11 made of a diffusion layer formed at a chip 10. In a gate length L of this gate electrode 12, a particularly high grade line width controllability will be achieved for the portion corrected in accordance with the key point (the portion of the center portion, minimum line width, or the maximum line width).

In the present embodiment having the above configuration, by correcting the optical proximity effect with respect to a design pattern by the optical proximity effect correcting means 3 and simulating the pattern after correction of the optical proximity effect by the simulation means 4, it is possible to generate a transfer pattern of the gate electrode and change the measurement portion in the transfer pattern of the gate electrode in accordance with the characteristics required from the circuit.

Then, by judging whether or not the deviation from the design value at the measurement point of the transfer pattern of the gate electrode as explained above is within the allowable range in accordance with whether the point required from the circuit is higher speed, stability, or reduction of the leakage current and repeating the feedback until the measurement point falls within the allowable range, the optimum correction can be carried out in accordance with the characteristic required from the circuit within the range for functioning as a gate electrode.

Further, the measurement points and the correction portions after simulation are limited to the lowest limit in accordance with the characteristics required from the circuit, so the correction time in the pattern correction can be shortened and consequently a reduction of the cost in the mask preparation can be achieved.

The present invention is not limited to the explanation of the above embodiment.

For example, in the measured value distribution generating means 6, an explanation was given of a case of generating a distribution of the amounts of deviation from the design patterns of the measured values of the transfer patterns measured by the transfer pattern measuring means 5, but it is also possible not to generate a distribution of the amounts of deviation, but to for example generate a distribution of the measured values per se of the transfer patterns of the gate electrodes. As this distribution, a distribution plotting the measured values of the patterns on the abscissa such as in the histograms shown in FIG. 8 to FIG. 10 can be employed. In this case, it may be judged by the judging means 7 whether or not there is a transfer pattern out of the gate length of the allowable range.

Further, it is also possible even if by the transfer pattern measuring means 5 and the measured value distributing means 6 generate all sorts of data concerning precision of the pattern, for example, the area of the pattern and the distribution of the amounts of distortion of the transfer patterns with respect to design patterns other than the line widths of the transfer patterns of the gate electrodes as the distribution.

Figure 13:
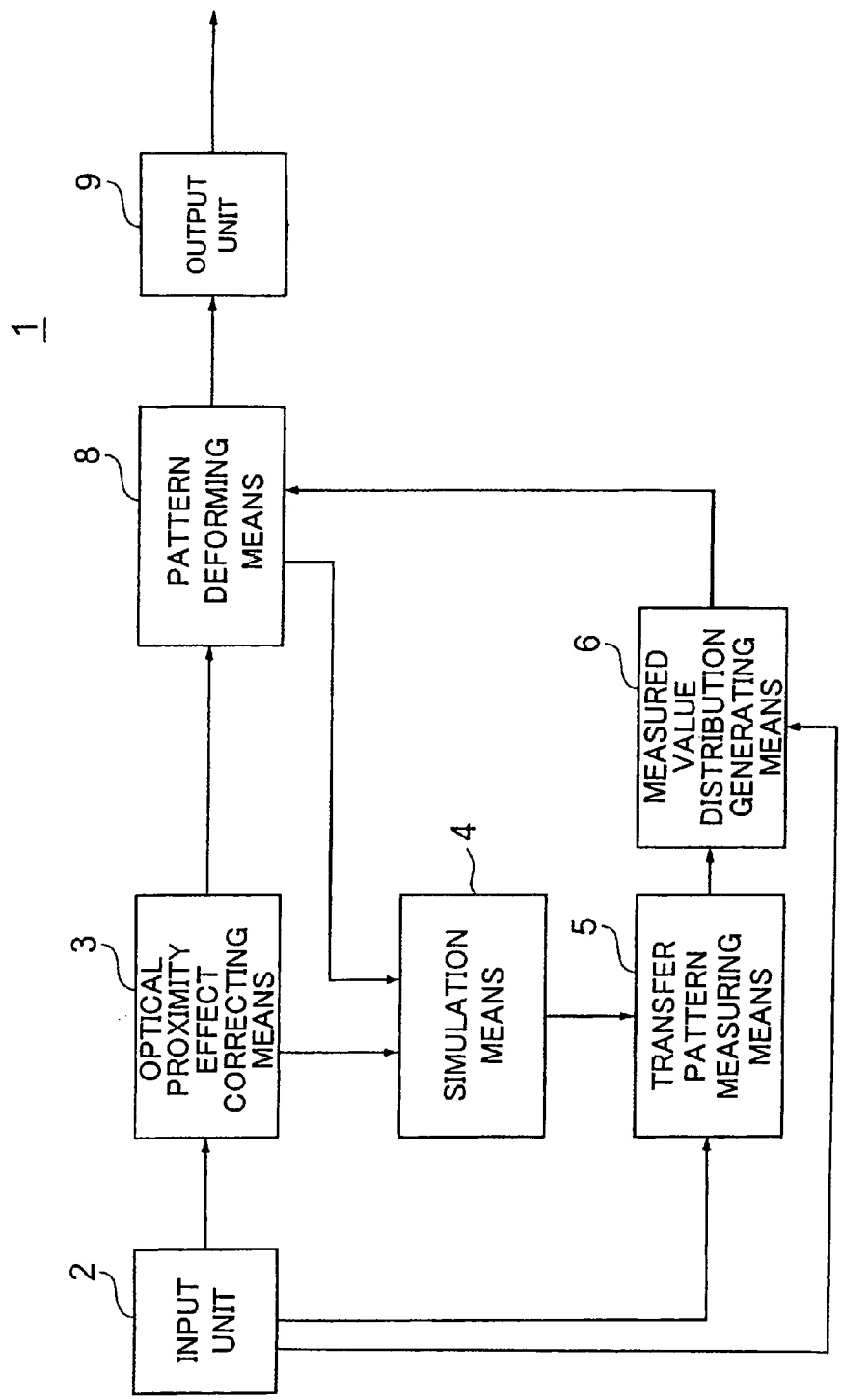
FIG. 13 is a block diagram of another example of a mask pattern correction apparatus.

Further, as shown in FIG. 13, it is also possible to eliminate the judging means 7 shown in FIG. 1 and directly output the data output from the measured value distribution generating means 6 to the pattern deforming means 8. When not providing the judging means 7, it is also possible not to judge whether or not there is a transfer pattern having a measured value out of the allowable range, but to output the amount of deviation data to the pattern deforming means 8 one after another and deform the corrected patterns by exactly the amounts of deviation.

Further, in the present embodiment, for example, an explanation was given of an example of a case of correcting an interconnect pattern having a portion forming the gate of the transistor or the like, but the present invention is not limited to this and can be applied similarly to various other design patterns. Namely, in other design patterns as well, it is sufficient to set a portion functionally related with the device characteristics up in advance and cover this portion in correction.

In the present embodiment, information of a transfer pattern of a gate electrode having a line width out of the allowable range (location and amount of deviation from the design value) were input from the judging means 7, and the pattern was deformed by exactly the amount of deviation from the design value by the pattern deforming means 8, but the amount of shift is not particularly limited so far as the amount of deviation can be brought within the allowable range.

For example, it is also possible to set the amount of shift so as to match the gate length having the greatest distribution within the allowable range among the distribution of deviations of the gate lengths generated by the measured value distribution generating means 6.

This is because even if a pattern deviates from the design value, if the amount of deviation is within the allowable range, the formation of gate electrodes having the same gate lengths is preferred from the viewpoint of variation of the characteristics.

For example, in the present embodiment, the distribution of deviation from the design values of the transfer patterns of the gate electrodes in the entire chip was generated by using the measured value distribution generating means 6, but also a configuration can be employed of having the judging means 7 judge the gate lengths of the transfer patterns of the gate electrodes individually measured by the transfer pattern measuring means 5 and output the information of the transfer patterns of the gate electrodes out of the allowable range (locations and amounts of deviation) to the pattern deforming means 8, it is possible to apply feedback and correct the patterns.

Further, in the present embodiment, the speed of the circuit, stability, and the reduction of the leakage current were mentioned as examples of the key points and the explanation given of an example where the maximum line width of the transfer patterns of the gate electrodes, the line width of the center portion, and the minimum line width were covered by correction in accordance with the key point, but the present invention is not limited to this. When it is possible to extract measurement points corresponding to other key points, the measurement points can be increased too.

As an example, an explanation was given of an example of the method of measurement by the transfer pattern measuring means 5, but it is also possible to measure the maximum line width of a transfer pattern of a gate electrode, the line width of the center portion, and the minimum line width by the another technique. Further, the technique for correction of the optical proximity effect by the optical proximity effect correcting means 3 and technique for simulation by the simulation means 4 are not particularly limited. Well known techniques can be employed.

Other than this, various modifications are possible within a range not out of the gist of the present invention.

INDUSTRIAL APPLICABILITY

The mask pattern correction apparatus, the mask pattern correction method, the mask preparation method, and the method of production of the semiconductor device of the present invention can be applied to for example the preparation of a mask used in a lithography step of a semiconductor device.

The invention claimed is:

1. A mask pattern correction apparatus comprising:
   an input unit having stored therein at least design patterns, transfer conditions for said design patterns, and key point information for said design patterns;
   an optical proximity effect correcting means for correcting an optical proximity effect with respect to a design pattern and a transfer condition output from said input unit;
   a simulation means receiving corrective patterns and transfer conditions from said optical proximity effect correcting means for finding by simulation a transfer pattern to be obtained when performing exposure under predetermined transfer conditions using a corrected pattern obtained by said correction of the optical proximity effect from said optical proximity effect correcting means;
   a transfer pattern measuring means receiving said design patterns and said key point information from said input unit for measuring a dimension or location of a portion functionally related with device characteristics in said found transfer pattern; and
   a pattern deforming means for deforming said corrected pattern so that the measured portion of said transfer pattern falls within an allowable range when said dimension or location is out of said allowable range.

2. A mask pattern correction apparatus as set forth in claim 1, wherein:
   said design pattern has an interconnect pattern having a portion becoming a gate of a device, and
   said transfer pattern measuring means measures a line width of a gate portion in said transfer pattern.

3. A mask pattern correction apparatus as set forth in claim 2, wherein said transfer pattern measuring means receives as input information relating to performance required in a device and changes a measured location of line width of said gate portion in accordance with said input information.

4. A mask pattern correction apparatus as set forth in claim 1, wherein said pattern deforming means deforms said corrected pattern by exactly an amount of deviation of said dimension or said location from said design pattern so that a measured portion of said transfer pattern falls in said allowable range when said dimension or location is out of an allowable range.

5. A mask pattern correction apparatus as set forth in claim 1, wherein:
said transfer pattern measuring means measures dimensions or locations of a plurality of portions functionally related to device characteristics and having the same dimensions in said transfer pattern, and
said pattern deforming means deforms said corrected pattern so as to approach a dimension or location of the greatest distribution in said allowable range when said dimension or location is out of said allowable range.

6. A mask pattern correction method comprising:
providing an input unit having stored therein at least design pattern, transfer conditions for said design patterns, and key point information for said design patterns;
a first step of correcting an optical proximity effect with respect to a design pattern and a transfer condition output from said output unit;
a second step of finding, in response to corrective patterns and transfer conditions in said optical proximity effect correcting step, by simulation a transfer pattern to be obtained when performing exposure under said predetermined transfer conditions by a corrected pattern obtained by correction of said optical proximity effect;
a third step of measuring, in response to said design patterns and said key point information from said input unit, a dimension or locations of a portion functionally related with device characteristics in said found transfer pattern;
a fourth step of judging whether or not said measured dimension or location is out of an allowable range; and
a fifth step of deforming said corrected pattern so that said measured portion of the transfer pattern falls within said allowable range when judging that measured said dimension or location is out of said allowable range.

7. A mask pattern correction method as set forth in claim 6, wherein:
said design pattern has an interconnect pattern having a portion becoming a gate of a device, and,
in said third step, measuring a line width of a gate portion in said transfer pattern.

8. A mask pattern correction method as set forth in claim 7, further comprising, at said third step, changing a measured location of line width of said gate portion in accordance with information relating to performance required from a device.

9. A mask pattern correction method as set forth in claim 6,
further comprising, at said third step, measuring dimensions or locations of a plurality of portions functionally related to device characteristics in a found transfer pattern,
further having a step, after said third step and before said fourth step, of generating a distribution of dimensions or locations of said measured plurality of portions, and,
at said fifth step, deforming said corrected pattern so as to approach a dimension or location of the greatest distribution in said allowable range when said dimension or location is out of said allowable range.

10. A mask pattern correction method as set forth in claim 6, further comprising, after said fifth step, performing the processing from said second step to said fifth step on said deformed recorrected pattern and repeating the processing from said second step to said fifth step until it is judged at said fourth step of judgment that there is no transfer pattern having a dimension or location out of said allowable range.

11. A mask preparation method comprising:
storing in an input unit at least design patterns, transfer conditions for said design patterns, and key point information for said design patterns;
a first step of correcting an optical proximity effect with respect to design patterns and a transfer condition output from said input unit;
a second step of finding, in response to corrective patterns and transfer conditions in said optical proximity effect correcting step, by simulation the transfer patterns to be obtained when performing exposure under said predetermined transfer conditions by the corrected patterns obtained by correction of said optical proximity effect;
a third step of measuring, in response to said design patterns an said key point information from said input unit, dimensions or locations of portions functionally related with device characteristics among said found transfer patterns;
a fourth step of judging whether or not said measured dimensions or locations are out of an allowable range;
a fifth step of deforming said corrected patterns so that said measured portions of the transfer patterns fall within said allowable range when judging that said measured dimensions or locations are out of said allowable range; and
a sixth step of preparing a mask having deformed recorrected patterns.

12. A mask preparation method as set forth in claim 11, wherein:
said design pattern has an interconnect pattern having a portion becoming a gate of a device, and,
in said third step, measuring a line width of a gate portion in said transfer pattern.

13. A mask preparation method as set forth in claim 12, further comprising, at said third step, changing a measured location of line width of said gate portion in accordance with information relating to performance required from a device.

14. A mask preparation method as set forth in claim 11,
further comprising, at said third step, measuring dimensions or locations of a plurality of portions functionally related to device characteristics in a found transfer pattern,
further having a step, after said third step and before said fourth step, of generating a distribution of dimensions or locations of said measured plurality of portions, and,
at said fifth step, deforming said corrected pattern so as to approach a dimension or location of the greatest distribution in said allowable range when said dimension or location is out of said allowable range.

15. A mask preparation method as set forth in claim 11, further comprising, after said fifth step, performing the processing from said second step to said fifth step on said deformed recorrected pattern and repeating the processing from said second step to said fifth step until it is judged at said fourth step of judgment that there is no transfer pattern having a dimension or location out of said allowable range.

16. A method of production of a semiconductor device comprising:
providing an input unit having stored therein ar least design patterns, transfer conditions for said design patterns, and key point information for said design patterns;
a first step of correcting an optical proximity effect with respect to design patterns and a transfer condition output from said output unit;

a second step of finding, in response to corrective patterns and transfer conditions in said optical proximity effect correcting step, by simulation the transfer patterns to be obtained when performing exposure under said predetermined transfer conditions by the corrected patterns obtained by correction of said optical proximity effect;

a third step of measuring, in response to said design patterns and said key point information from said input unit, dimensions or locations of portions functionally related with device characteristics among found said transfer patterns;

a fourth step of judging whether or not measured said dimensions or locations are out of an allowable range;

a fifth step of deforming said corrected patterns so that said measured portions of the transfer patterns fall within said allowable range when judging that said measured dimensions or locations are out of said allowable range;

a sixth step of preparing a mask having deformed recorrected patterns; and a seventh step of performing exposure under the same conditions as said transfer conditions via said prepared mask having said recorrected patterns to transfer the patterns to the semiconductor device.

17. A method of production of a semiconductor device as set forth in claim 16, wherein:
said design pattern has an interconnect pattern having a portion becoming a gate of a device, and,
in said third step, measuring a line width of a gate portion in said transfer pattern.

18. A method of production of a semiconductor device as set forth in claim 17, further comprising, at said third step, changing a measured location of line width of said gate portion in accordance with information relating to performance required from a device.

19. A method of production of a semiconductor device as set forth in claim 16,
further comprising, at said third step, measuring dimensions or locations of a plurality of portions functionally related to device characteristics in a found transfer pattern,
further having a step, after said third step and before said fourth step, of generating a distribution of dimensions or locations of said measured plurality of portions, and,
at said fifth step, deforming said corrected pattern so as to approach a dimension or location of the greatest distribution in said allowable range when said dimension or location is out of said allowable range.

20. A method of production of a semiconductor device as set forth in claim 16, further comprising, after said fifth step, performing the processing from said second step to said fifth step on said deformed recorrected pattern and repeating the processing from said second step to said fifth step until it is judged at said fourth step of judgment that there is no transfer pattern having a dimension or location out of said allowable range.

* * * * *